July 6, 1965 W. C. BROWN 3,193,788

MULTILAYER CIRCUIT ASSEMBLY WITH CONNECTING PIN

Filed May 28, 1962 2 Sheets-Sheet 1

INVENTOR
WILLIAM C. BROWN
BY Herbert Sonnemayer
ATTORNEY

MULTILAYER CIRCUIT ASSEMBLY WITH CONNECTING PIN

Filed May 28, 1962 2 Sheets-Sheet 2

INVENTOR
*WILLIAM C. BROWN*
BY Herbert Sonnemeyer
ATTORNEY 3,193,788
Patented July 6, 1965

3,193,788

MULTILAYER CIRCUIT ASSEMBLY WITH CONNECTING PIN

William C. Brown, Edina, Minn., assignor to Sperry Rand Corporation, New York, N.Y., a corporation of Delaware Filed May 28, 1962, Ser. No. 198,233
6 Claims. (Cl. 339—18)

The invention relates generally to the electrical interconnection of circuitry disposed on superimposed printed circuit cards and more specifically to a solderless interconnecting means used to effectuate the interconnection.

Printed circuits are well known and extensively used in the electronics industry. Recent trends in the industry toward miniaturization of electronic devices have resulted in a variety of printed circuit packaging schemes for arranging a compact circuit assembly. For reducing circuit card space requirements, special packaging techniques have been developed which permit integration of the circuit cards into a single unit. In one such technique the printed circuit cards are disposed in stacked or superimposed relation. Electrical interconnections of circuitry disposed on different card levels within the stack are then made by a plurality of individual interconnecting means which are located internal to the stack itself.

Fabrication of a multilayer circuit assembly utilizing the aforementioned type of interconnecting means is accomplished by stacking a plurality of circuit cards having a predetermined pattern of plated-through holes or apertures in registered relation. The circuitry portion of each card may consist of conductive strips on the planar surface of the card and are electrically connected to selected conductive aperture linings. Since the cards are in registration with one another, plated-through holes line up with one another, thereby forming a continuous socket. An interconnecting means, in the form of an electrically conductive resilient tubular member, is then inserted into the series of aligned holes. Being resilient, the member radially expands to thereby frictionally engage the conductive aperture linings and make electrical contact therewith. Card circuitry on different levels is thereby electrically connected through the interconnecting resilient tube.

In the past, interconnecting means available for application in the above discussed apparatus have been found unsatisfactory in certain applications. For example, when using such an interconnecting means with a circuit assembly wherein the circuit cards are stacked in very close relation, aperture diameters are critical. If the diameter of one aperture in an aligned series of apertures is somewhat smaller than the next, the resilient interconnecting member is prevented from expanding a sufficient amount to make reliable electrical contact with the conductive linings of both apertures. In the light of such a limitation it becomes necessary to exercise vigilant control during the initial drilling of the apertures and the subsequent processes whereby the conductive lining is formed on each aperture surface. Critical process control requires experienced operators, the use of precision tools and special techniques for forming the apertures and is generally expensive and therefore undesirable.

A substantially similar problem arises, if during assembly of the stack of printed circuit cards, one card is slightly out of registration with the next adjacent card. This has the effect of reducing aperture diameter with the resultant problem mentioned above. Alignment of the cards is, therefore, critical and imposes additional costly control measures.

The present invention overcomes the aforementioned objections by providing an interconnecting means which permits the production of printed circuit cards free from such costly control measures. This is accomplished in accord with the present invention by providing a tubular interconnecting member which has independent self-adjusting means to compensate for varying aperture diameters. This means takes the form of a plurality of resilient projections extending angularly outwardly from the surface of the resilient tubular member. The projections are disposed circumferentially about the member, and define a circle, the diameter of which is approximately one and one-half times the diameter of the aperture in the circuit cards. Upon insertion of the member into an aligned series of apertures, certain projections on the member frictionally engage selected aperture linings making electrical contact therewith. Since each projection functions independently, they are free to adapt to a variation in aperture diameters.

Accordingly, it is an object of the present invention to provide an interconnection system for a multilayer circuit assembly wherein the interconnecting means is capable of adjusting to a variation in aperture diameters.

It is a further object of this invention to provide a multilayer circuit assembly interconnecting means which permits a cost savings in the production of printed circuit cards used in the assembly.

It is also an object of this invention to provide a multilayer circuit assembly interconnecting means which permits assembly and disassembly of the circuit organization.

These and other more detailed and specific objectives will be disclosed in the course of the following specification, reference being made to the accompanying drawings, in which.

Figure 1:
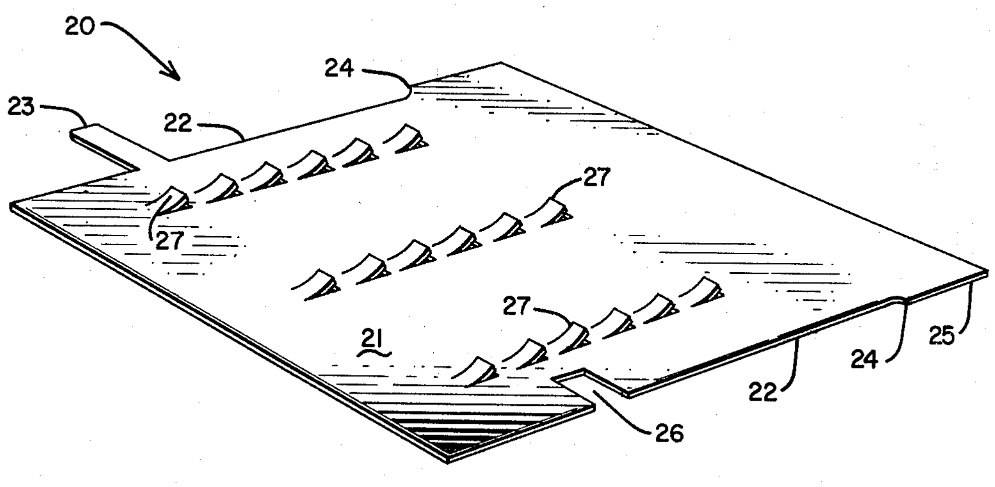
FIG. 1 is a perspective view of a metal section prior to its being formed into the connector pin of this invention.

Referring now to FIG. 1, there is seen a rectangularly shaped metal section 20 which exhibits at one end thereof two shoulder portions 24. Extending from one of the longitudinal edges 22 is an alignment tab 23, having a mating recess 26 which appears in the opposite edge 22. Arranged in a plurality of regularly spaced longitudinal and transverse rows are a plurality of rectangularly shaped, similarly dimensioned, resilient projections 27. The projections preferably form an angle of about 35° with respect to the surface 21 of the section 20 and all open toward the shoulder end thereof. The length and width of the individual projections depend upon the specific application for which the pin member is intended.

In the present embodiment, the section 20 has been formed from a sheet of a beryllium-copper alloy which has been tempered to a predetermined degree of strength and resiliency. The blanking has been accomplished, with the exception of the assignment of the angular disposition to the projection, by chemical milling. Portions of the beryllium-copper sheet are selectively removed by etching, the specific process employed being similar to etching techniques commonly utilized in the fabrication of printed circuit cards. The projections may be angulated by swaging, the bottom form having appropriately angled recesses and the top form having complementary extensions thereon. When it is economically desirable to provide forming dies, the metal section 20 as seen in FIG. 1 may be formed from strips of beryllium-copper by conventional die stamping and forming operations. Although beryllium-copper has been found, in the light of the many design factors considered, to be a particularly suitable alloy for fabricating the herein discussed preferred embodiment, other alloys, such as Phosphor-bronze, may also be used.

Figure 2:
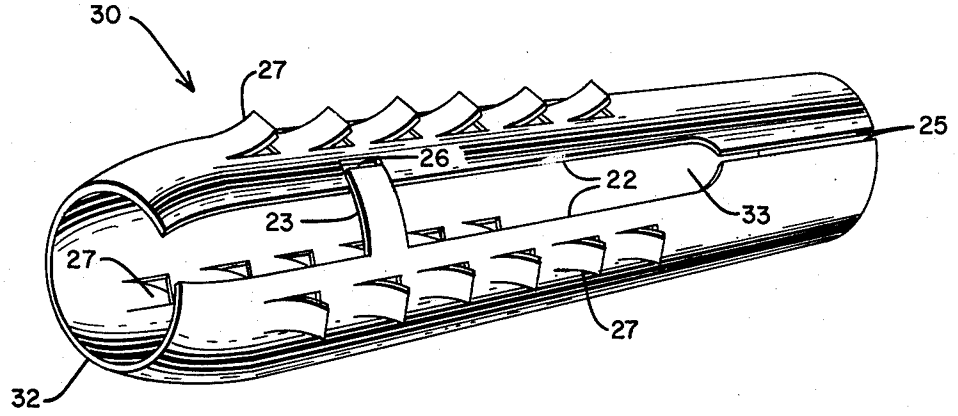
FIG. 2 is a perspective view of the preferred embodiment of the present invention.

Referring now to FIG. 2, there is seen a tubular connector pin 30 which has been formed from section 20 by causing the edges 22 to converge, the edges 25 of the shoulder portions 24 being brought into substantial abutting relation. During the tubular forming operation, the tab 23 is located in the recess 26 and one end 32 of the pin 30 is slightly tapered or rounded, the annular opening at that end being of less diameter than the opening at the opposite end of the pin. A longitudinal slit 33 of varying width is thereby formed and extends effectively from one end of the pin to the other. The tab 23 is disposed in the recess 26 for preventing torsional deformation, and to preclude relative longitudinal movement of the edges 22. After the sheet 20 is rolled into a tabular form, the transverse rows of the projections appear as circumferential rows and will be so referred to hereinafter. The circumferential rows of projections are substantially equidistantly spaced apart, as are also the longitudinal rows. Each circumferential row includes one projection from each longitudinal row and therefore, in the embodiment illustrated there are three projections in each circumferential row. No limitation is intended by providing a specific number of projections in any circumferential row. A greater or lesser number of projections may be employed depending on the degree of reliability desired which is compatible with other requirements or limitations.

Additionally, the pin member need not be tubular in form. If desired, the pin may take a solid cylindrical or rectangular form, and the resilient projections may be welded or otherwise jointed to the pin member.

Figure 3:
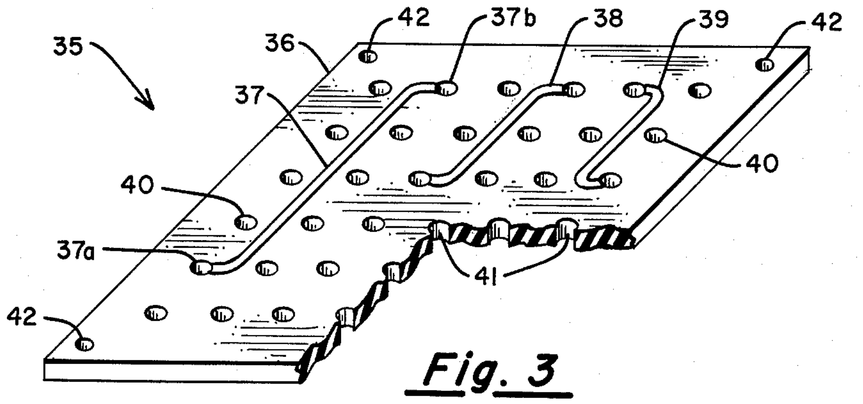
FIG. 3 is a perspective view of a multi-apertured, single-layered printed circuit card of the present embodiment, a small portion of the card being shown in cross-section.

Referring now to FIGURE 3, there is seen a multi-apertured circuit card 35 of the type that is utilized with the present invention. The card is conventional and includes an insulating base material 36 and a plurality of conductive strips 37, 38 and 39. The printed circuit base material may be prepared from a ceramic material or from various types of resins reinforced as desired, and in the preferred embodiment has a thickness of approximately 0.062 inch. In fabricating the printed circuit cards, apertures, such as the apretures 40, are drilled or otherwise formed therein in accordance with a predetermined arrangement. For example, in the instant embodiment the aperture pattern is prepared by drilling, the apertures 40 being formed at the intersection of lines forming a 0.100 inch grid. The apertures 40 in the instant embodiment have an approximate diameter of 0.052 inch when formed. However, the aperture diameter may be varied in accord with design requirements and any suitable combination of apterure diameter and connector pin diameter may be utilized.

Covering at least a portion of the wall of each aperture is an electrically conductive coating or metal lining 41. This coating may take the form of a separable sleeve member such as an eyelet but is preferably an electrodeposited coating, the aperture with its conductive lining being commonly referred to as a plated-through hole. An acceptable method for preparing the circuit card after the apertures have been formed therein, includes chemically depositing a layer of copper on all exposed surfaces of the card and increasing the thickness of the layer by electrodepositing additional copper thereon. The predetermined arrangement of conductive strips, such as strips 37, 38, and 39, and conductive linings 41 of each aperture 40 are formed by chemically removing the copper in selected areas to leave behind the metal forming the aforementioned elements. The strips terminate at the apertures as at 37*a* and 37*b* and are electrically connected to the aperture linings. The width of the conductive strips may be in the range of 0.0010–0.0020 inch. The thickness of the copper lining deposited inside each aperture may be approximately .0015 inch and reduces the inside diameter of the hole approximately .003 inch. The apertures 42, located at the corners of the card 35, are formed therein after the other elements of the card are formed and therefore have no conductive lining.

Figure 4:
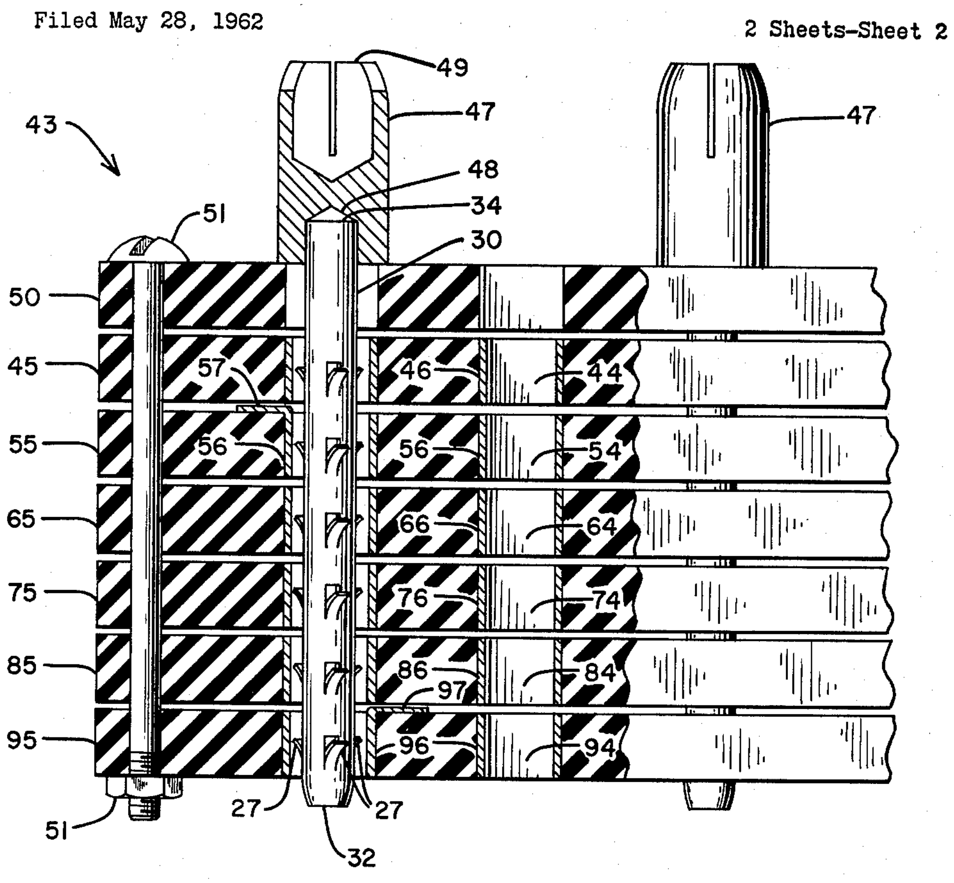
FIG. 4 is a cross-sectional side view of a portion of a stack of printed circuit cards illustrating the disposition of the interconnecting means in a socket formed by an aligned series of apertures.

Referring now to FIG. 4, there is seen a multilayer circuit assembly 43 which includes the superimposed printed circuit cards 45, 55, 65, 75, 85, and 95. These circuit cards are substantially identical with circuit card 35 with the exception that the different cards exhibit different circuit patterns. An insulating cover plate 50 may be placed on top of the uppermost circuit card 45 for protecting that card and its associated circuitry. The cover plate has no conductive material thereon and has an aperture pattern therein which corresponds to the circuit card aperture patterns. The assembly 43 may be held together by a clamping means, such as the nut and bolt arrangement 51, the bolt passing through each circuit card by way of the corner apertures 42 therein.

After the circuit cards of the multilayer assembly 43 are registered, the apertures of adjacent cards align to form an aligned series of apertures as illustrated by apertures 44, 54, 64, 74, 84, and 94. Collectively these apertures, together with their respective conductive linings 46, 56, 66, 76, 86, and 96, effectively form a tubular socket. Inserted into each socket is a pin member 30, which has at least one circumferential row of projections 27 for resiliently engaging the conductive lining of each aperture in a series. The projections of each row define a circle the diameter of which is approximately one and one-half times that of any aperture in the series for assuring the frictional engagement of the projections with the conductive aperture lining. The distance between the circumferential rows of projections is approximately equal to the center-to-center distance of adjacent cards. Thus, the projections of any circumferential row are arranged to frictionally engage the corresponding aperture lining for establishing an electrical connection between the pin member and the aperture linings. During insertion of the pin into printed circuit stack, the projections independently conform to the diameter of their corresponding apertures. Even though two adjacent apertures in a series have different diameters, an electrical connection is made between the pin member and the conductive linings.

Experience has revealed that in some handling operations a few of the projections may be bent or otherwise distorted such that they are ineffective to establish electrical contact as desired. To avoid rejects and costly repair processes, three projections have been provided to engage each aperture lining. Thus, even though one or two projections of a set of three have been rendered ineffective, the pin member will still provide a reliable electrical interconnection. It is to be understood, however, if careful handling procedures are employed, that a single projection may be employed for resiliently contacting each aperture lining, and no limitation is intended by segregating projections in sets of three. Further with respect to the orientation of projections, it should be understood that the projections in any circumferential row need not be in perfect alignment. That is, as long as a set of three projections make electrical contact with a single aperture lining they are to be considered as forming one circumferential row.

When properly disposed in the socket, the connector pin interconnects circuitry located on different levels in the stack. This is exemplified in FIG. 4 where the conductive strip 97 on card 95 is connected by way of the aperture lining 96 through the corresponding projections 27 in contact therewith, to the connector pin 30. Connected to strip 97 through the pin 30 is the conductive strip 57 on circuit card 55. If desired, external electrical connection to pin 30 may be made by way of the female connector 47 which frictionally receives in its recess 48 the upper portion 34 of the pin member. External leads (not shown) may be secured in the recess 49 of the connector 47 by a male pin insert (not shown).

When it is desired to modify the circuit assembly 43, the connector pins may be removed without damage to the assembly. After removal of the female connector 47 the connector pins may be pushed out of the assembly. This may be accomplished by axially inserting into each pin member a tubular tool (not shown). Pressure on the tool will cause the pin to move out of the circuit assembly.

It is to be understood that suitable modifications may be made in the structure as disclosed provided such modifications come within the spirit and scope of the appended claims. Having now, therefore, fully illustrated and described my invention, what I claim to be new and desire to protect by Letters Patent is:

1. An elongated tubular electrical connecting pin having openings at its opposite ends and a longitudinal slit extending from end to end thereof and having a pair of longitudinal edges disposed in substantial abutting relation, one of the edges having an alignment tab thereon and the other of the edges having a recess therein, the tab being located substantially within the recess; a plurality of resilient projections, each projection having one end integrally associated with the pin and its other end disassociated from the pin, the other end extending outwardly from the external surface of the pin such that the projection forms an acute angle with respect to the external surface, the acute angle formed by each projection opening toward only one end of the pin, the projections being arranged in a plurality of circumferentially substantially equidistantly spaced longitudinal rows, the projections in any one of the rows being longitudinally substantially equidistantly spaced from one another and a plurality of substantially equidistantly spaced circumferential rows, each of the circumferential rows including only one projection from each longitudinal row.

2. A multilayer circuit assembly comprising: a stacked plurality of layers of electrically insulating supports, each of the supports having a plurality conductive strips thereon and having a plurality of apertures therethrough arranged in accordance with a predetermined pattern, the apertures of one of the supports being aligned with the apertures of the other ones of the supports, and the conductive strips terminating at predetermined ones of the apertures; an electrically conductive material covering at least a portion of the wall of each of the apertures, the material being electrically connected to selected ones of the strips; an interconnecting means disposed through an aligned series of the apertures, the interconnecting means including an elongated tubular electrical connecting pin having openings at its opposite ends and a longitudinal slit extending from end to end thereof and having a plurality of similarly dimensioned resilient projections, each projection having one end integrally associated with the pin and its other end disassociated from the pin, the other end being spaced from the external surface of the pin such that the projection forms an outwardly extending inclined surface with respect to the external surface, the projections being arranged on the pin in a plurality of circumferentially spaced longitudinal rows and being spaced-apart in a longitudinal direction for resiliently engaging the conductive material and making electrical contact therewith.

3. A multilayer circuit assembly comprising: a plurality of electrically insulating supports disposed in substantially parallel relationship and arranged to form a stack, each of the supports having a plurality of conductive strips thereon and having a plurality of apertures therethrough arranged in accordance with a predetermined pattern, the apertures of one of the supports being aligned with the apertures of the other ones of the supports, and the conductive strips terminating at predetermined ones of the apertures; an electrically conductive material covering at least a portion of the wall of each of the apertures, the material being electrically connected to selected ones of the strips; an interconnecing means disposed through an aligned series of the apertures, the interconnecting means including an elongated tubular electrical connecting pin having openings at its opposite ends and a longitudinal slit extending from end to end thereof and having a plurality of similarly dimensioned resilient projections, each projection having one end integrally associated with the pin and its other end disassociated from the pin, the other end being spaced from the external surface of the pin such that the projection forms an outwardly extending inclined surface with respect to the external surface, the projections being arranged on the pin in spaced-apart relation in a longitudinal direction for resiliently electrically engaging the conductive material to thereby electrically interconnect selected ones of the strips.

4. A multilayer circuit assembly comprising: a stacked plurality of layers of electrically insulating supports, each of the supports having a plurality of conductive strips thereon and having a plurality of apertures therethrough arranged in accordance with a predetermined pattern, the apertures of one of the supports being aligned with the apertures of the other ones of the supports, and the conductive strips terminating at predetermined ones of the apertures; an electrically conductive material covering at least a portion of the wall of each of the apertures, the material being electrically connected to selected ones of the strips; an interconnecting means disposed through an aligned series of the apertures, the interconnecting means including an elongated tubular electrical connecting pin having openings at its opposite ends and a longitudinal slit extending from end to end thereof and having a plurality of resilient projections, the projections being disposed such that each projection forms an outwardly extending inclined surface with respect to the external surface of the pin, the projections being arranged on the pin in spaced-apart relation in a longitudinal direction for resiliently electrically engaging the conductive material to electrically interconnect predetermined ones of the strips.

5. A multilayer circuit assembly comprising: a plurality of superimposed layers of electrically insulating supports, each of the supports having a plurality of conductive strips thereon and having a plurality of apertures therethrough arranged in accordance with a predetermined pattern, the apertures of one of the supports being aligned with the apertures of the other ones of the supports, and the conductive strips terminating at predetermined ones of the apertures; an electrically conductive material covering at least a portion of the wall of each of the apertures, the material being electrically connected to selected ones of the strips; an interconnecting means disposed through an aligned series of the apertures, the interconnecting means including an elongated tubular electrical connecting pin having a plurality of resilient projections, the projections being disposed such that each projection forms an outwardly extending inclined surface with respect to the external surface of the pin, the projections being arranged on the pin in a plurality of circumferentially spaced longitudinal rows and a plurality of spaced-apart circumferential rows for resiliently electrically engaging the conductive material to electrically interconnect selected ones of the strips.

6. A multilayer circuit assembly comprising: a stacked plurality of layers of electrically insulating supports disposed such that the center to center distance of adjacent supports is substantially similar, each of the supports having a plurality of conductive strips thereon and having a plurality of apertures therethrough arranged in accordance with a predetermined pattern, the apertures of one of the supports being aligned with the apertures of the other ones of the supports, and the conductive strips terminating at predetermined ones of the apertures; an electrically conductive material covering at least a portion of the wall of each of the apertures, the material being electrically connected to selected ones of the strips; and interconnecting means disposed through an aligned series of the apertures, the interconnecting means including an elongated tubular electrical connecting pin having a plurality of resilient projections for electrically engaging the conductive material on the walls of an aligned series of apertures, the projections being disposed such that each projection forms an outwardly extending inclined surface with respect to the external surface of the pin, the projections being arranged on the pin in a plurality of circumferentially spaced longitudinal rows and a plurality of spaced circumferential rows, the distance between circumferential rows corresponding to the center to center distance between adjacent supports.

References Cited by the Examiner

UNITED STATES PATENTS

| | | | |
|---|---|---|---|
| 1,376,735 | 5/21 | Stalhane et al. | 339—258 X |
| 1,948,540 | 12/34 | Nelson | 339—95 |
| 2,158,003 | 5/39 | Douglas | 339—205 |
| 2,689,337 | 9/54 | Burtt et al. | 339—258 X |
| 2,752,580 | 6/56 | Shewmaker | 339—252 X |
| 3,049,645 | 8/62 | Skirpan | 339—18 X |
| 3,083,351 | 3/63 | Nielsen | 339—258 X |

FOREIGN PATENTS

| | | |
|---|---|---|
| 70,102 | 10/58 | France. |
| 1,110,714 | 7/61 | Germany. |
| 8,303 | 1898 | Great Britain. |
| 357,101 | 11/61 | Switzerland. |

JOSEPH D. SEERS, *Primary Examiner.*

ALFRED S. TRASK, *Examiner.*